(12) United States Patent
Higashisaka (10) Patent No.: US 11,251,134 B2
(45) Date of Patent: Feb. 15, 2022

(54) SEMICONDUCTOR MODULE AND METHOD FOR MANUFACTURING SAME

(71) Applicant: SHARP KABUSHIKI KAISHA, Sakai (JP)

(72) Inventor: Hiroyoshi Higashisaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/616,473

(22) PCT Filed: Mar. 13, 2018

(86) PCT No.: PCT/JP2018/009646
§ 371 (c)(1),
(2) Date: Nov. 24, 2019

(87) PCT Pub. No.: WO2018/216318
PCT Pub. Date: Nov. 29, 2018

(65) Prior Publication Data
US 2020/0185333 A1 Jun. 11, 2020

(30) Foreign Application Priority Data
May 26, 2017 (JP) .............................. JP2017-104763

(51) Int. Cl.
*H01L 23/544* (2006.01)
*H01L 33/00* (2010.01)
(Continued)

(52) U.S. Cl.
CPC ........ *H01L 23/544* (2013.01); *H01L 25/0753* (2013.01); *H01L 33/0093* (2020.05);
(Continued)

(58) Field of Classification Search
CPC .............. H01L 23/544; H01L 33/0093; H01L 25/0753; H01L 33/62; H01L 2223/54426;
(Continued)

(56) References Cited

U.S. PATENT DOCUMENTS

2001/0049152 A1  12/2001  Taniguchi et al.
2015/0362770 A1* 12/2015  Yang ................. G02F 1/133512
                                                      349/42
(Continued)

FOREIGN PATENT DOCUMENTS

JP     H11-330604 A    11/1999
JP     2002-344028 A   11/2002
(Continued)

*Primary Examiner* — Shahed Ahmed
(74) *Attorney, Agent, or Firm* — ScienBiziP, P.C.

(57) ABSTRACT

A semiconductor module includes a base material, an alignment mark provided on a surface of the base material and plural semiconductor elements that are individually provided on the surface of the base material while being juxtaposed to the alignment mark and that are separated from each other. Accordingly, a semiconductor module and a method for manufacturing the semiconductor module are provided which may prevent an alignment mark from being peeled off and remaining as a foreign object and may improve reliability.

7 Claims, 7 Drawing Sheets

(51) Int. Cl.
*H01L 25/075* (2006.01)
*H01L 33/62* (2010.01)

(52) U.S. Cl.
CPC .... *H01L 33/62* (2013.01); *H01L 2223/54426* (2013.01); *H01L 2933/0066* (2013.01)

(58) Field of Classification Search
CPC ......... H01L 2933/0066; H01L 21/6835; H01L 2221/68354; H01L 25/065; H01L 25/07; H01L 25/18; H01L 21/02; H01L 2224/0213; H01L 2224/0217; H01L 2224/0224; H01L 2021/60067–6009; B81C 99/007; G02F 2001/133354
See application file for complete search history.

(56) References Cited

U.S. PATENT DOCUMENTS

| | | | |
|---|---|---|---|
| 2016/0071897 A1 | | 3/2016 | Tsukimura |
| 2016/0216806 A1* | | 7/2016 | Nakamura ............ G06F 3/0446 |
| 2018/0275458 A1* | | 9/2018 | Lin ....................... G02F 1/1333 |

FOREIGN PATENT DOCUMENTS

| | | |
|---|---|---|
| JP | 2009-164521 A | 7/2009 |
| JP | 2014-239157 A | 12/2014 |
| JP | 2015-103541 A | 6/2015 |

* cited by examiner

SEMICONDUCTOR MODULE AND METHOD FOR MANUFACTURING SAME

CROSS REFERENCE TO RELATED APPLICATIONS

The present application claims benefit of priority to Japanese Patent Application No. 2017-104763 filed on May 26, 2017, the entire contents of which are hereby incorporated by reference.

TECHNICAL FIELD

This invention relates to a semiconductor module that includes an alignment mark and a method for manufacturing the same.

BACKGROUND ART

As a semiconductor module in related art, there has been a semiconductor module in which plural LED chips are mounted on an LSI chip (chip on chip). An example is a semiconductor module in which respective LED chips of R, G, and B are mounted on an LSI chip which drives and controls the LED chips.

In a method for manufacturing such a semiconductor module, an individual or plural LED chips are picked up on an LSI chip at a time, and 100 LED chips are mounted on the LSI chip, for example.

CITATION LIST

Patent Literature

PTL 1: Japanese Unexamined Patent Application Publication No. 2009-164521

SUMMARY OF INVENTION

Technical Problem

In such a method for manufacturing a semiconductor module in related art, precision of alignment between an LSI chip and LED chips is important.

That is, in a semiconductor module, the positional precision of LED chips lowers due to misalignment, and discomfort to eyes may be caused. Further, in order to have all of many LEDs as designed and not to cause the discomfort, high alignment precision is requested, and this results in a very large cost.

Further, also in a method for manufacturing a semiconductor module, it is difficult to align all of many LEDs as designed, and there is trouble in which misalignment is caused by a subsequent bonding process of both chips.

Accordingly, it is possible to in advance form plural LED chips on a second base material, bond that to an LSI chip, and thereafter peel off the second base material. Here, an alignment mark (a first alignment mark segment provided on the LED chip side and a second alignment mark segment provided on the LSI chip side) is used for alignment between the plural LED chips and the LSI chip.

In such a manufacturing process of the semiconductor module, the alignment mark becomes unnecessary after finishing alignment or connection between one semiconductor chip and the other semiconductor chip.

However, there has been a problem that because the alignment mark segments are not connected with each other, when the second base material on which the one semiconductor chip is formed is peeled off in a post-process, the alignment mark is not removed together with the second base material, the alignment mark is peeled off, floats, and falls, from the second base material, remaining as a foreign object, and reliability thus lowers.

Note that PTL 1 (Japanese Unexamined Patent Application Publication No. 2009-164521) discloses a semiconductor device that may prevent scattering of a process mark in dicing and a method for manufacturing the same. However, the semiconductor device and the method are not intended to prevent peeling of an alignment mark in a case where plural semiconductor elements that are in advance formed on a base material are bonded to a base material and thereafter only the base material on which the plural semiconductor elements are formed is peeled off.

In consideration of the above description, an object of the present invention is to provide a semiconductor module and a method for manufacturing the semiconductor module, the semiconductor module and the method which may prevent an alignment mark from being peeled off and remaining as a foreign object and may improve reliability.

Solution to Problem

A semiconductor module according to one aspect of this invention includes: a base material; an alignment mark that is provided on a surface of the base material; and a plurality of semiconductor elements that are individually provided on the surface of the base material while being juxtaposed to the alignment mark and that are separated from each other.

Further, a method for manufacturing a semiconductor module according to one aspect of this invention is a method for manufacturing a semiconductor module, the semiconductor module using: a first base material on whose surface a first alignment mark segment is provided; and a second base material on whose surface a second alignment mark segment and a plurality of semiconductor elements which are juxtaposed to the second alignment mark segment and separated from each other are provided. The method includes: an alignment process of performing alignment between the first base material and the plurality of semiconductor elements by using superposition of the first alignment mark segment and the second alignment mark segment; and a bonding process of bonding the plurality of semiconductor elements of the second base material and the first base material together and bonding the first base material and the second alignment mark segment together after the alignment process.

Advantageous Effects of Invention

As it is clear from the above, an object of this invention is to provide a semiconductor module and a method for manufacturing the semiconductor module, the semiconductor module and the method which may prevent an alignment mark from being peeled off and remaining as a foreign object and may improve reliability.

DESCRIPTION OF EMBODIMENTS

A semiconductor module and a method for manufacturing the same of this invention will be described hereinafter in detail with illustrated embodiments.

First Embodiment

FIG. 1 to FIG. 7 are diagrams that explain processes of a method for manufacturing a semiconductor module of a first embodiment of this invention, and the method for manufacturing the semiconductor module will be described hereinafter based on FIG. 1 to FIG. 7.

Figure 1:
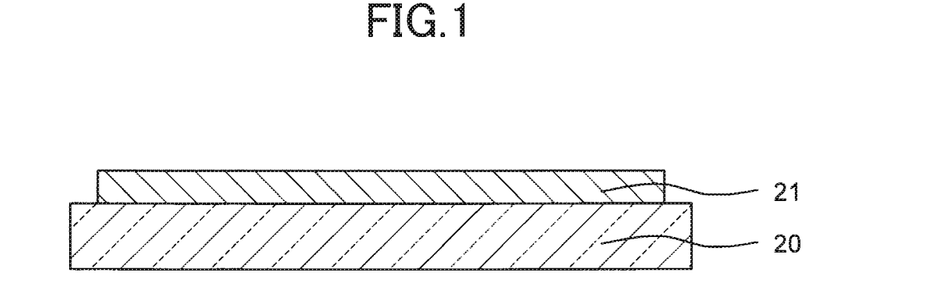
FIG. 1 is a cross-sectional diagram that illustrates a process of forming a semiconductor lamination layer on a sapphire substrate in a method for manufacturing a semiconductor module of a first embodiment of this invention.

In the method for manufacturing the semiconductor module of the first embodiment, as illustrated in FIG. 1, a semiconductor lamination layer 21 that includes a light emitting layer is first formed by epitaxial growth on a sapphire substrate 20 as one example of a second base material.

Figure 2:
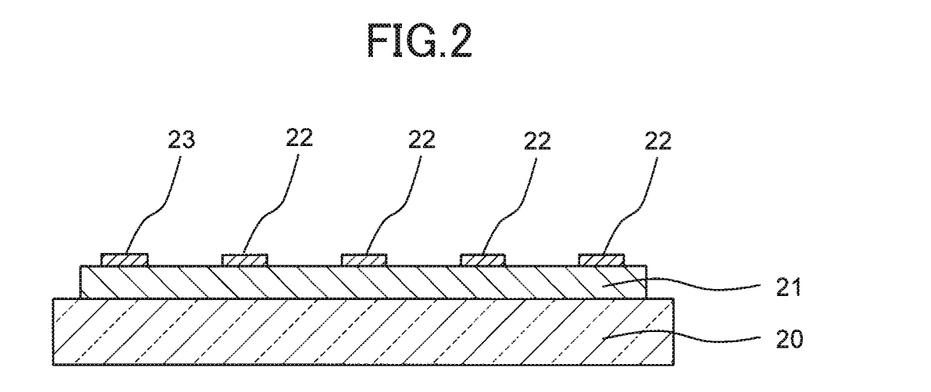
FIG. 2 is a cross-sectional diagram that illustrates a process of forming electrodes on the semiconductor lamination layer of the sapphire substrate.

Next, as illustrated in FIG. 2, plural electrodes 22 and a metal layer 23 to become a portion of a second alignment mark segment 25 are formed on the semiconductor lamination layer 21 of the sapphire substrate 20. The electrode 22 is one example of a second connection pattern.

Figure 3:
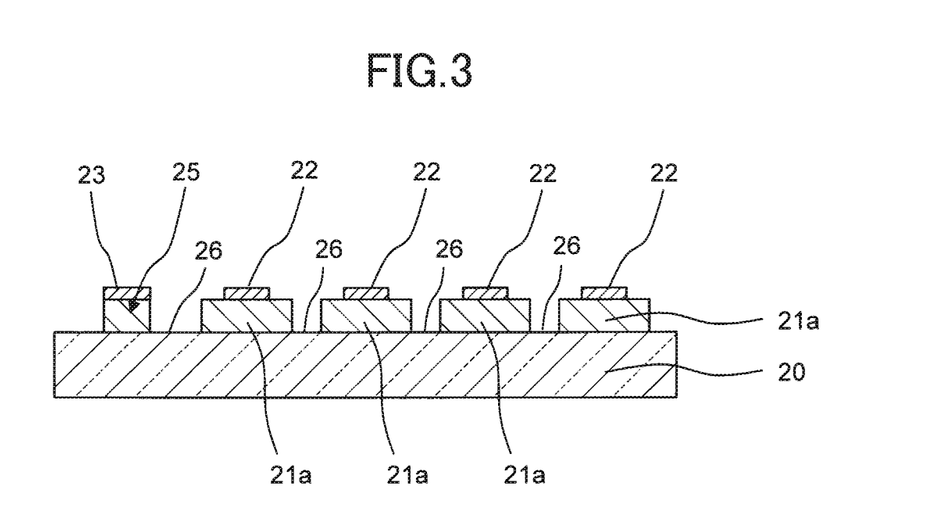
FIG. 3 is a diagram that illustrates a process of forming separation grooves in the semiconductor lamination layer of the sapphire substrate.

Next, as illustrated in FIG. 3, separation grooves 26 are formed by patterning the semiconductor lamination layer 21 of the sapphire substrate 20. The separation grooves 26 are formed in the middle among the electrodes 22 in a lattice manner. Accordingly, plural light emitting elements 21a are formed which are arranged on the sapphire substrate 20 at intervals from each other in a lattice manner. In this case, the second alignment mark segment 25 juxtaposed to the plural light emitting elements 21a is formed by patterning the semiconductor lamination layer 21. The second alignment mark segment 25 includes the semiconductor lamination layer 21 and the metal layer 23 formed of the same material as the electrode 22.

The plural light emitting elements 21a of the first embodiment are light emitting elements that use a GaN-based semiconductor.

Figure 4:
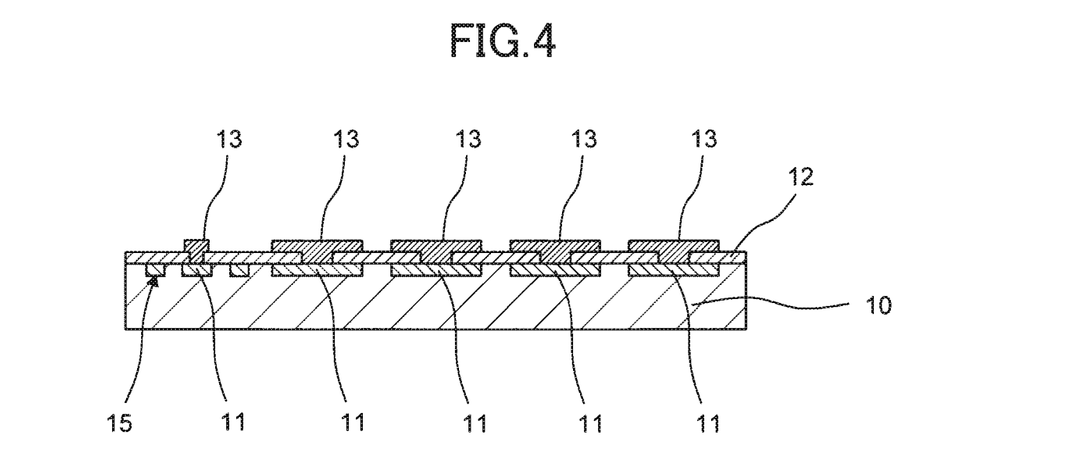
FIG. 4 is a cross-sectional diagram of an Si circuit substrate.

Next, as illustrated in FIG. 4, plural electrodes 11 and a first alignment mark segment 15 are formed on a surface of an Si circuit substrate 10 as one example of a first base material. The electrode 11 is one example of a first connection pattern.

Wiring (not illustrated) is formed on the surface of the Si circuit substrate 10 when the plural electrodes 11 and the first alignment mark segment 15 are formed. An integrated circuit that drives and controls the plural light emitting elements 21a is formed on the Si circuit substrate 10.

Next, an insulating film 12 is formed on the Si circuit substrate 10, and the insulating film 12 is patterned by dry etching, wet etching, or the like such that portions of the plural electrodes 11 are exposed.

Next, bumps 13 are respectively formed to cover exposed regions of portions of the plural electrodes 11 of the Si circuit substrate 10.

Figure 5:
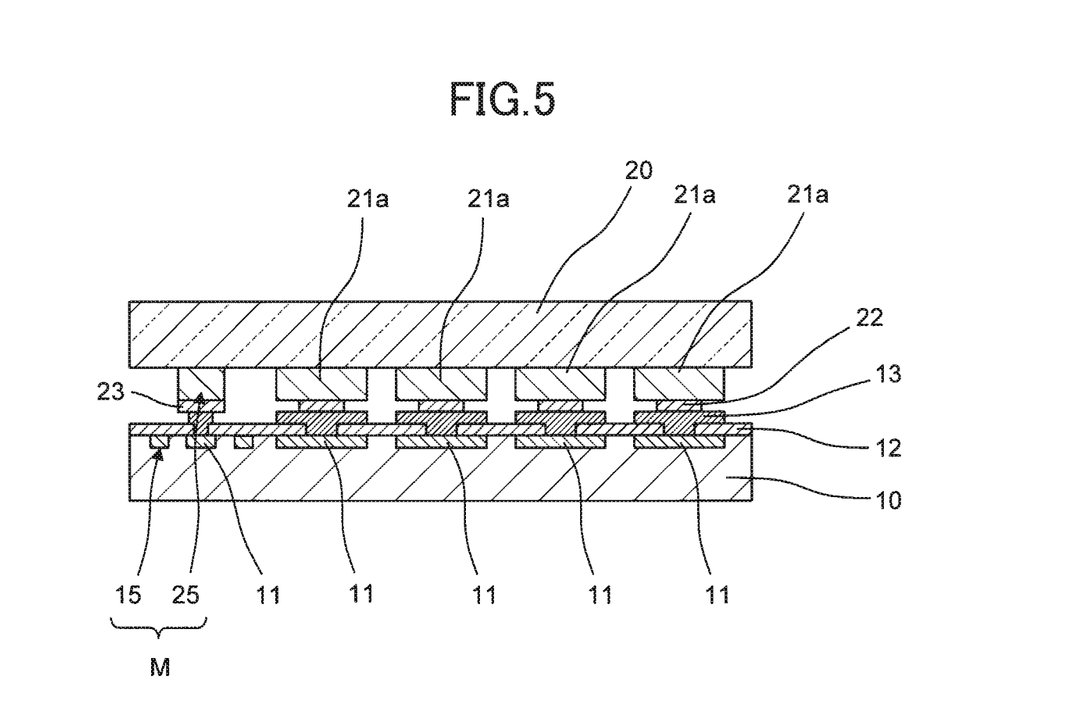
FIG. 5 is a cross-sectional diagram that illustrates a process of bonding the sapphire substrate and the Si circuit substrate together.

Next, as illustrated in FIG. 5, the sapphire substrate 20 and the Si circuit substrate 10 are bonded together. In this case, the electrodes 22 on the sapphire substrate 20 side are aligned with the electrodes 11 of the Si circuit substrate 10 by using the second alignment mark segment 25 on the sapphire substrate 20 side and the first alignment mark segment 15 of the Si circuit substrate 10, and the electrodes 22 on the sapphire substrate 20 side and the electrodes 11 of the Si circuit substrate 10 are connected together via the bumps 13 by thermo-compression bonding, ultrasonic bonding, or the like.

Here, the second alignment mark segment 25 on the sapphire substrate 20 side and the electrode 11 of the Si circuit substrate 10 are connected together via the bump 13. Accordingly, an alignment mark M is configured with the first alignment mark segment 15 and the second alignment mark segment 25.

Figure 6:
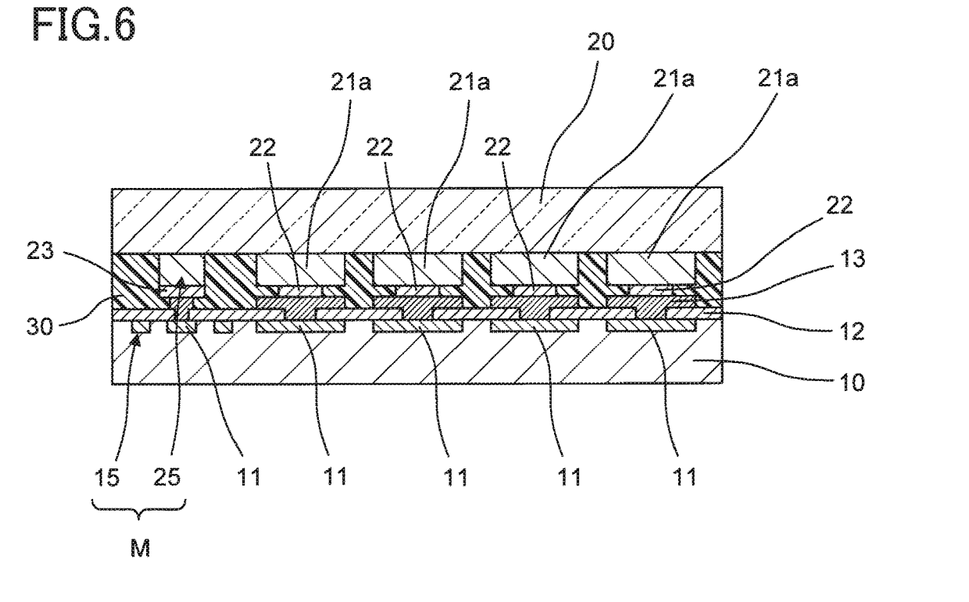
FIG. 6 is a cross-sectional diagram that illustrates a process of filling a portion between the sapphire substrate and the Si circuit substrate with liquid resin.

Next, as illustrated in FIG. 6, portions between the light emitting elements 21a on the sapphire substrate 20 side and the Si circuit substrate 10 are filled with liquid resin by capillary action (underfill filling process).

As a condition for the underfill filling, a temperature range of 50° C. to 200° C. is desirable. A temperature range of 80° C. to 170° C. is more desirable, and a temperature range of 100° C. to 150° C. is most desirable.

Then, the filled liquid resin is thermally cured, and a resin layer 30 is thereby formed.

Figure 7:
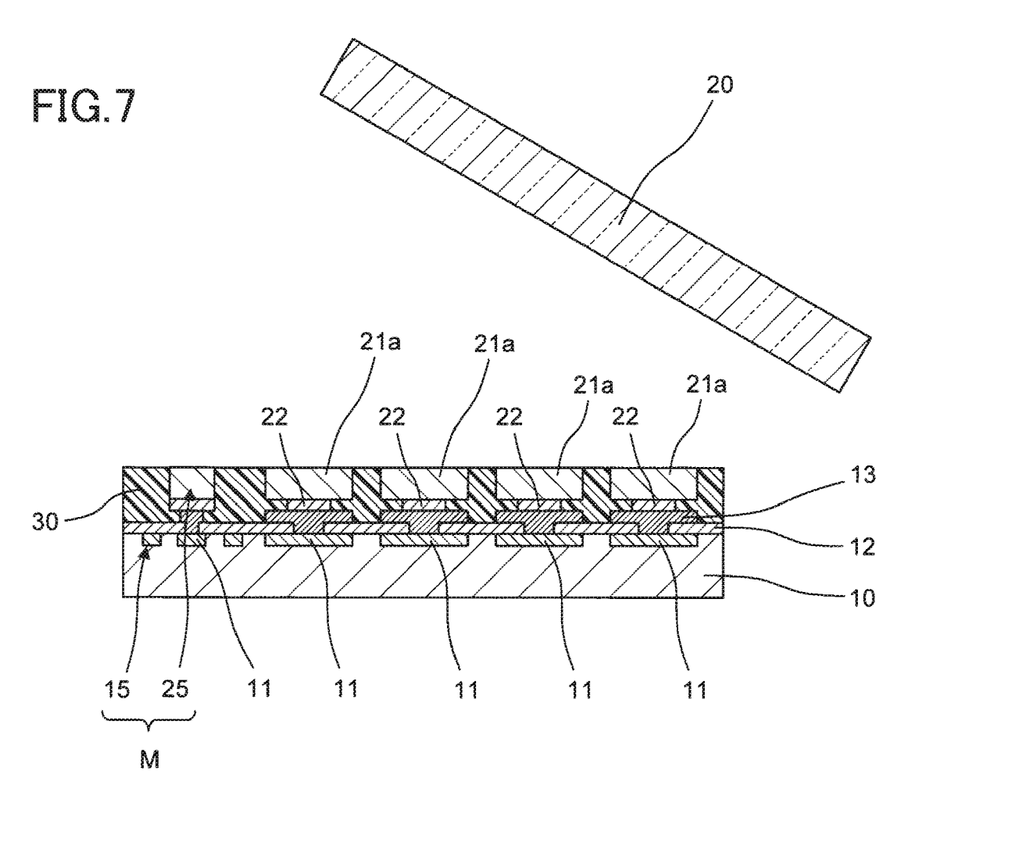
FIG. 7 is a cross-sectional diagram that illustrates a process of peeling off the sapphire substrate on the Si circuit substrate.

Next, as illustrated in FIG. 7, the sapphire substrate 20 on the Si circuit substrate 10 is peeled off. Here, laser lift-off or the like is used for peeling of the sapphire substrate 20. Accordingly, a basic configuration of the semiconductor module is prepared. An inspection of misalignment by the alignment mark M and formation of a protection film are performed in a post-process, and the semiconductor module is completed.

Figure 8:
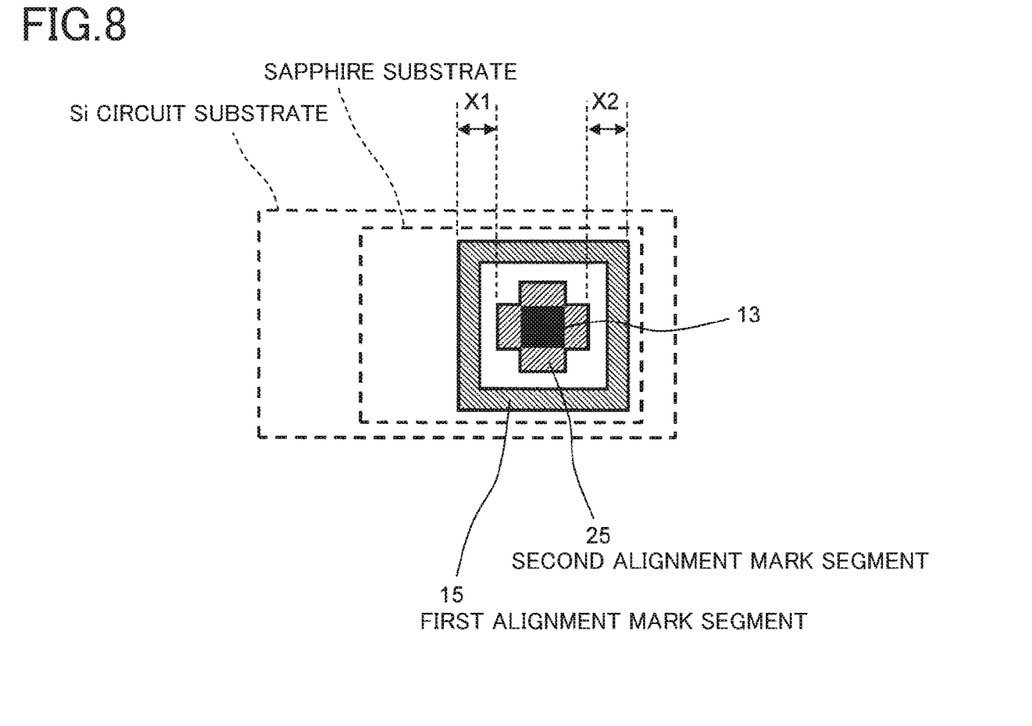
FIG. 8 is a plan diagram of an alignment mark of the Si circuit substrate and an alignment mark of the sapphire substrate.

FIG. 8 is a plan diagram of the first alignment mark segment 15 of the Si circuit substrate 10 and the second alignment mark segment 25 of the sapphire substrate 20.

As illustrated in FIG. 8, the first alignment mark segment 15 has a square frame shape, and the second alignment mark segment 25 has a cross shape.

The sapphire substrate 20 and the Si circuit substrate 10 are bonded together such that the second alignment mark segment 25 is positioned at the center of the first alignment mark segment 15, and the electrodes 22 on the sapphire substrate 20 side are thereby aligned with the electrodes 11 of the Si circuit substrate 10.

In the method for manufacturing the semiconductor module of the first embodiment, 100 light emitting elements 21a are aligned by one pair of first and second alignment mark segments 15 and 25, the positional precision of the 100 light emitting elements 21a may thereby be secured, and arrangement non-uniformity of the light emitting elements 21a is prevented. Accordingly, a display device that uses the semiconductor module does not cause discomfort to eyes of a person. Further, alignment of the light emitting elements 21a may be realized at a low cost and with high precision.

A pattern with the combination of the first alignment mark segment 15 and the second alignment mark segment 25 may be shared as a positioning measure in plural processes.

Further, the pattern with the combination of the first alignment mark segment 15 and the second alignment mark segment 25 may be shared by using the pattern as an inspection pattern in a subsequent inspecting process. For example, as illustrated in FIG. 8, intervals X1 and X2 between opposed sides of the first alignment mark segment 15 and sides of protrusion portions of the second alignment mark segment 25 are measured, and the misalignment between the first alignment mark segment 15 and the second alignment mark segment 25 is inspected based on the intervals X1 and X2.

The semiconductor module in the above configuration includes the Si circuit substrate 10 (first base material), the alignment mark M provided on the surface of the Si circuit substrate 10, and the plural light emitting elements 21a (semiconductor elements) that are individually provided on the surface of the Si circuit substrate 10 while being juxtaposed to the alignment mark M and that are separated from each other. Thus, the alignment mark M peeled off as a foreign object may be prevented from remaining in the semiconductor module, and reliability may be improved.

Further, the alignment mark M is formed with the first alignment mark segment 15 and the second alignment mark segment 25. Thus, when the sapphire substrate 20 (second base material) on which the plural light emitting elements 21a are in advance formed is bonded to the Si circuit substrate 10 (first base material), the second alignment mark segment 25 provided on the sapphire substrate 20 is bonded to the Si circuit substrate 10 on which the first alignment mark segment 15 is formed, and the alignment mark M is formed with the first and second alignment mark segments 15 and 25. Accordingly, the alignment mark M may certainly be prevented from being peeled off from the Si circuit substrate 10 in a manufacturing process in which only the sapphire substrate 20 is peeled off.

Further, a surface of the alignment mark M and surfaces of the plural light emitting elements 21a are provided on substantially the same plane, and the first and second alignment mark segments 15 and 25 that are connected together may thereby be utilized as a level difference prevention measure in a case where a protection film or the like is formed on the surfaces, for example.

Further, in the method for manufacturing the semiconductor module, alignment between the Si circuit substrate 10 (first base material) and the plural light emitting elements 21a (semiconductor elements) is performed by using superposition of the first alignment mark segment 15 and the second alignment mark segment 25, the plural light emitting elements 21a of the sapphire substrate 20 (second base material) and the Si circuit substrate 10 are thereafter bonded together, and the Si circuit substrate 10 and the second alignment mark segment 25 are bonded together. Accordingly, in a subsequent process of peeling off the sapphire substrate 20, scattering of the first and second alignment mark segments 15 and 25 may be prevented.

Further, alignment between the electrodes 11 of the Si circuit substrate 10 and the plural light emitting elements 21a may accurately be performed by using the first and second alignment mark segments 15 and 25, and arrangement non-uniformity of the plural light emitting elements 21a may be prevented.

Figure 9:
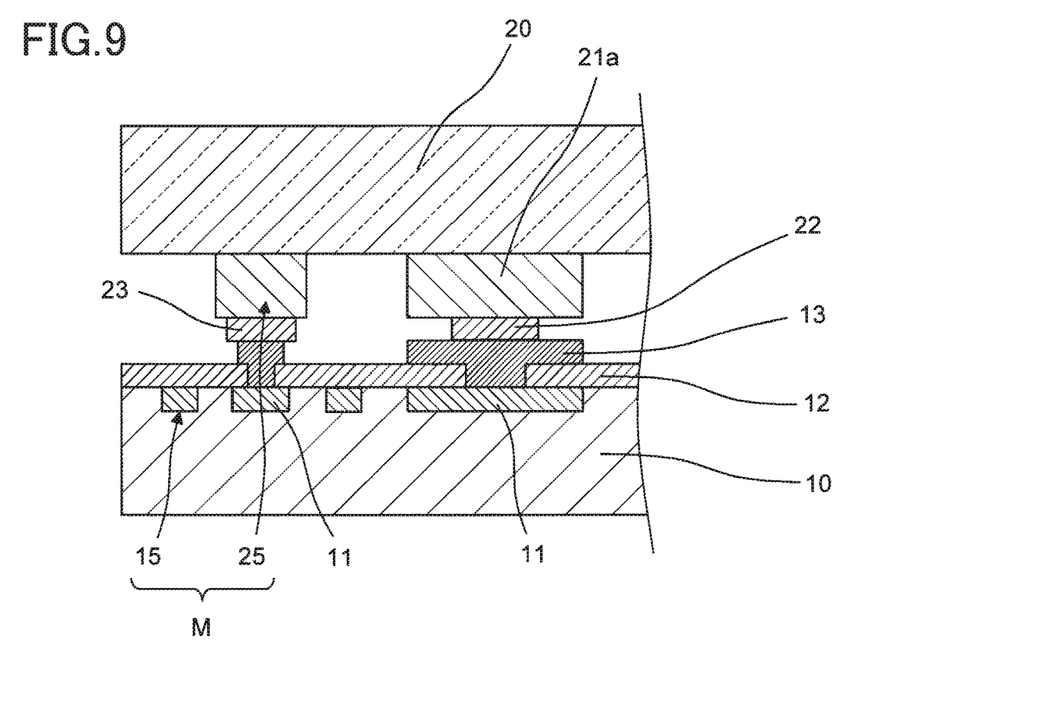
FIG. 9 is a first modification example of the semiconductor module of the first embodiment.

Note that in FIG. 5, a side surface of the second alignment mark segment 25 is positioned substantially the same as a side surface of the metal layer 23. However, in a first modification example illustrated in FIG. 9, a side surface of an metal layer 23 is positioned inside the side surface of the second alignment mark segment 25.

Further, in FIG. 5, the first alignment mark segment 15 is covered by the insulating film 12. However, in a second modification example illustrated in FIG. 10, a portion of the first alignment mark segment 15 is exposed by patterning the insulating film 12, and the bump 13 is formed on the exposed portion of the first alignment mark segment 15.

Figure 10:
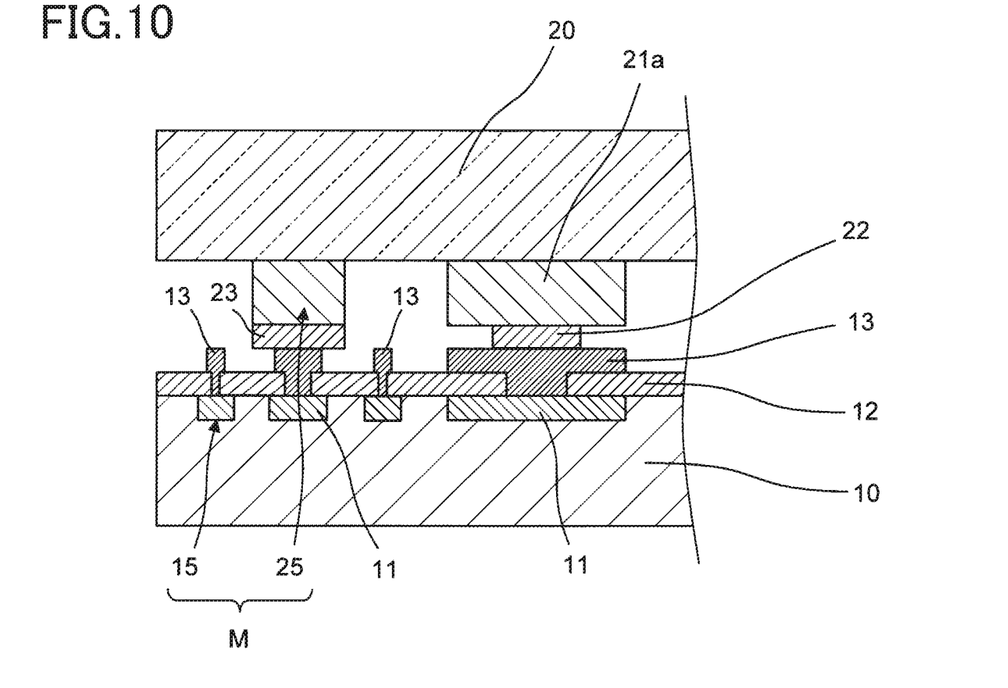
FIG. 10 is a second modification example of the semiconductor module.

Further, in FIG. 10, the side surface of the second alignment mark segment 25 is positioned substantially the same as the side surface of the metal layer 23. However, in a third modification example illustrated in FIG. 11, the side surface of the metal layer 23 is positioned inside the side surface of the second alignment mark segment 25.

Figure 11:
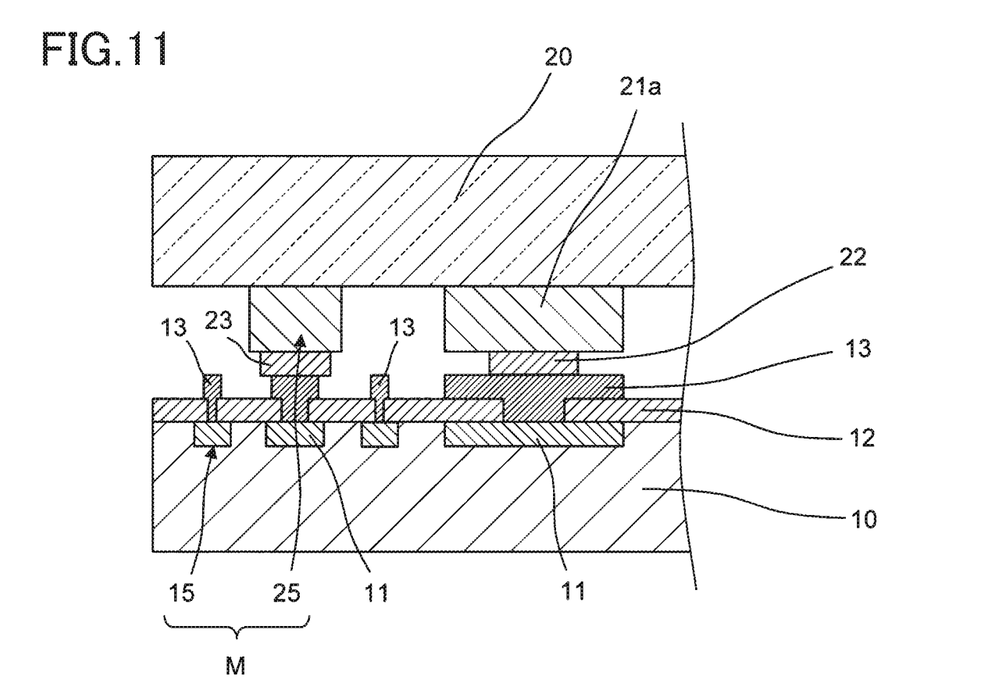
FIG. 11 is a third modification example of the semiconductor module.

Note that in cases of FIG. 10 and FIG. 11, the plan diagram of FIG. 8 has the bump 13 in a square frame shape instead of the first alignment mark segment 15. Note that the bump 13 may be in a frame shape of a rectangle or the like other than a square frame shape.

In the semiconductor module of the first embodiment, the base material 10 and the plural light emitting elements 21a (semiconductor elements) are connected together by the electrodes 11 (first connection patterns) and the electrodes 22 (second connection patterns) and thereby form a current path. On the other hand, a portion between the first alignment mark segment 15 and the second alignment mark segment 25 is a non-current path.

Second Embodiment

In the first embodiment, a description is made about the semiconductor module in which the 100 light emitting elements 21a are aligned by one pair of first and second alignment mark segments 15 and 25 and the method for manufacturing the same. In a semiconductor module and a method for manufacturing the same of a second embodiment of this invention, 10,000, 20,000, 30,000, of 50,000 light emitting elements are aligned by one pair of first and second alignment mark segments.

Note that 10,000, 20,000, 30,000, or 50,000 light emitting elements may be aligned by plural pairs of first and second alignment mark segments.

The method for manufacturing the semiconductor module of the second embodiment provides a similar effect to the method for manufacturing the semiconductor module of the first embodiment.

Third Embodiment

In the first and second embodiments, a description is made about the semiconductor modules in which the light emitting elements 21a as the semiconductor elements are formed on the Si circuit substrate 10 (first base material) and the methods for manufacturing the same. In a semiconductor module and a method for manufacturing the same of a third embodiment of this invention, plural semiconductor elements in another configuration than the light emitting element are mounted on the first base material. For example, a stack structure is possible in which a control IC chip is mounted on a memory chip (first base material).

The method for manufacturing the semiconductor module of the third embodiment provides a similar effect to the method for manufacturing the semiconductor module of the first embodiment.

The specific embodiments of this invention have been described. However, this invention is not limited to the first to third embodiments but may be carried out by performing various changes within the scope of this invention. For example, appropriate combinations of the contents described in the first to third embodiments may be provided as one embodiment of this invention.

Further, as for the alignment mark, it is matter of course that plural alignment marks may be provided in an outer peripheral portion of plural semiconductor elements.

Figure 12:
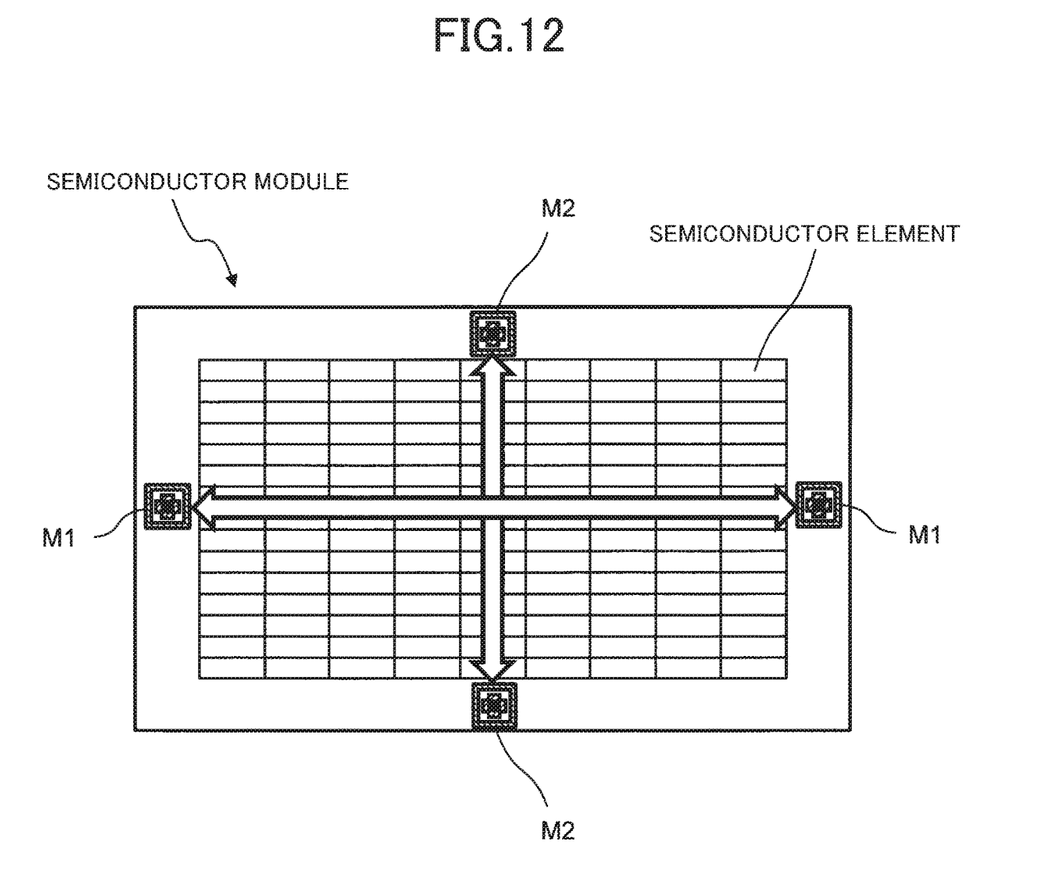
FIG. 12 is an arrangement example of the alignment marks of the semiconductor module of the first embodiment.
Figure 13:
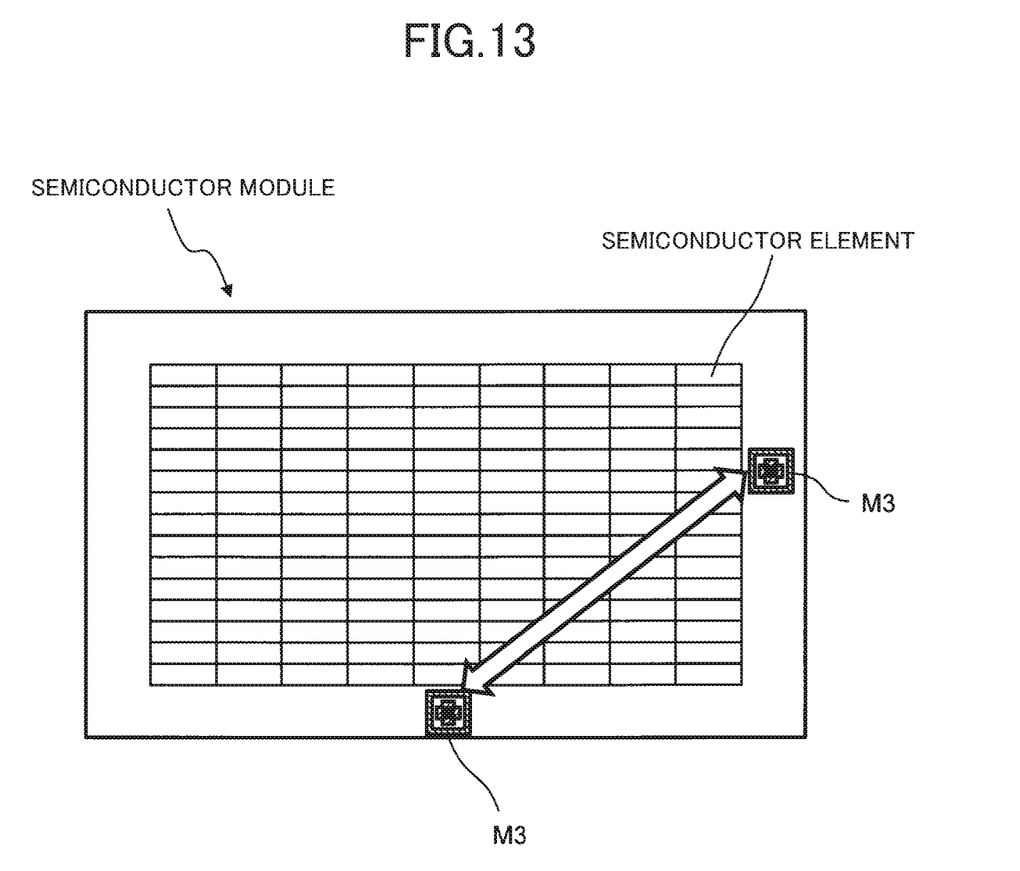
FIG. 13 is another arrangement example of the alignment marks of the semiconductor module.

For example, as illustrated in FIG. 12, in a semiconductor module in which plural semiconductor elements are disposed in a lattice manner, one pair of alignment marks M1 and M1 placed in the horizontal direction may be provided, and one pair of alignment marks M2 and M2 placed in the vertical direction may be provided. Alternatively, as illustrated in FIG. 13, one pair of alignment marks M3 and M3 may be provided along an oblique direction (in FIG. 13, an oblique direction at approximately 45 degrees with respect to the horizontal direction).

In addition, it is matter of course that a configuration is possible which separately includes an inspecting pattern, which is formed of the same material as the pattern with the combination of the first alignment mark segment 15 and the second alignment mark segment 25, in a position that does not overlap with the above alignment mark and on a base material positioned in an outer peripheral portion of plural semiconductor elements.

This invention and the embodiments will be summarized as follows.

A semiconductor module according to one aspect of this invention includes: a base material 10; an alignment mark M that is provided on a surface of the base material 10; and plural semiconductor elements 21a that are individually provided on the surface of the base material 10 while being juxtaposed to the alignment mark M and that are separated from each other.

In the above configuration, the semiconductor module includes the base material 10, the alignment mark M provided on the surface of the base material 10, and the plural semiconductor elements 21a that are individually provided on the surface of the base material 10 while being juxtaposed to the alignment mark M and that are separated from each other. Thus, the alignment mark M peeled off as a foreign object may be prevented from remaining in the semiconductor module, and reliability may be improved.

Further, in the semiconductor module of one embodiment, the alignment mark M is configured with a first alignment mark segment 15 and a second alignment mark segment 25.

In the above embodiment, the alignment mark M is formed with the first alignment mark segment 15 and the second alignment mark segment 25. Thus, in a case where a substrate on which the plural semiconductor elements 21a are in advance formed is bonded to the base material 10, the first and second alignment mark segments 15 and 25 provided on the substrate and the base material 10 are bonded to each other, and the alignment mark M may thereby certainly be prevented from being peeled off from the base material 10 in a manufacturing process in which only the substrate is peeled off.

Further, in the semiconductor module of one embodiment, a surface of the alignment mark M and surfaces of the plural semiconductor elements 21a are provided on a substantially same plane.

In the above embodiment, the surface of the alignment mark M and the surfaces of the plural semiconductor elements 21a are provided on substantially the same plane, and the alignment mark M may thereby be utilized as a level difference prevention measure in a case where a protection film or the like is formed on the surfaces, for example.

Further, a method for manufacturing a semiconductor module according to one aspect of this invention is a method for manufacturing a semiconductor module, the semiconductor module using: a first base material 10 on whose surface a first alignment mark segment 15 is provided; and a second base material 20 on whose surface a second alignment mark segment 25 and plural semiconductor elements 21a which are juxtaposed to the second alignment mark segment 25 and separated from each other are provided. The method includes: an alignment process of performing alignment between the first base material 10 and the plural semiconductor elements 21a by using superposition of the first alignment mark segment 15 and the second alignment mark segment 25; and a bonding process of bonding the plural semiconductor elements 21a of the second base material 20 and the first base material 10 together and bonding the first base material 10 and the second alignment mark segment 25 together after the alignment process.

In the above configuration, alignment between the first base material 10 and the plural semiconductor elements 21a is performed by using superposition of the first alignment mark segment 15 and the second alignment mark segment 25, the plural semiconductor elements 21a of the second base material 20 and the first base material 10 are thereafter bonded together, and the first base material 10 and the second alignment mark segment 25 are bonded together. Thus, scattering of the first and second alignment mark segments 15 and 25 may be prevented in a subsequent process of peeling off the second base material 20. Consequently, the alignment mark may be prevented from being peeled off and remaining as a foreign object, and reliability may be improved.

Further, alignment between the base material 10 and the plural semiconductor elements 21a may accurately be performed by using the first and second alignment mark segments 15 and 25, and arrangement non-uniformity of the plural semiconductor elements 21a may be prevented.

Further, in the method for manufacturing a semiconductor module of one embodiment, a pattern with a combination of the first alignment mark segment 15 and the second alignment mark segment 25 is used in a post-process.

In the above embodiment, the pattern with the combination of the first alignment mark segment 15 and the second alignment mark segment 25 may be shared as a positioning measure in plural processes.

Further, in the method for manufacturing a semiconductor module of one embodiment, the post-process includes an inspecting process in which the pattern with the combination of the first alignment mark segment 15 and the second alignment mark segment 25 is used as an inspection pattern.

In the above embodiment, the pattern with the combination of the first alignment mark segment 15 and the second alignment mark segment 25 may be shared by using the pattern as an inspection pattern in a subsequent inspecting process.

Further, a semiconductor module according to one aspect of this invention is a semiconductor module including a base material 10, and plural semiconductor elements 21a and an alignment mark M which are arranged on a surface of the base material 10. First connection patterns 11 are provided on the surface of the base material 10 and second connection patterns 22 are provided on sides of the base material 10 of the plural semiconductor elements 21a. The base material 10 and the plural semiconductor elements 21a are connected together by the first connection patterns 11 and the second connection patterns 22. A first alignment mark segment 15 formed of the same material as the first connection patterns 11 is provided on the surface of the base material 10 and a second alignment mark segment 25 configured with the same material as the second connection patterns 22 and the semiconductor elements 21a is formed on the first alignment mark segment 15. The alignment mark M is formed with the first alignment mark segment 15 and the second alignment mark segment 25.

In the above configuration, the alignment mark M peeled off as a foreign object may be prevented from remaining in the semiconductor module, and reliability may be improved.

Further, in the semiconductor module of one embodiment, the base material 10 and the plural semiconductor elements 21a are connected together by the first connection patterns 11 and the second connection patterns 22 and form a current path, and a portion between the first alignment mark segment 15 and the second alignment mark segment 25 is a non-current path.

Further, in the semiconductor module of one embodiment, the plural alignment marks M1 to M3 are arranged in an outer peripheral portion of the plural semiconductor elements 21a.

REFERENCE SIGNS LIST

10 Si circuit substrate (first base material, base material)
11 electrode
12 insulating film
13 bump
15 first alignment mark segment
20 sapphire substrate (second base material)
21 semiconductor lamination layer
21a light emitting element (semiconductor element)
22 electrode
23 metal layer
25 second alignment mark segment
M, M1 to M3 alignment mark

The invention claimed is:

1. A semiconductor module comprising:
a base material;
an alignment mark that is provided on a surface of the base material; and
a plurality of semiconductor elements that are individually provided on the surface of the base material while being juxtaposed to the alignment mark and that are separated from each other, wherein
first connection patterns are provided on the surface of the base material,
the alignment mark is configured with a first alignment mark segment and a second alignment mark segment, and
the second alignment mark segment and one of the first connection patterns are connected with each other via a bump.

2. The semiconductor module according to claim 1, wherein
a surface of the alignment mark and surfaces of the plurality of semiconductor elements are provided on a substantially same plane.

3. The semiconductor module according to claim 1, wherein
a plurality of the alignment marks are arranged in an outer peripheral portion of the plurality of semiconductor elements.

4. The semiconductor module according to claim 1, wherein
a resin layer is provided between the plurality of semiconductor elements.

5. A semiconductor module comprising:
a base material; and
a plurality of semiconductor elements and an alignment mark which are arranged on a surface of the base material, wherein
first connection patterns are provided on the surface of the base material and second connection patterns are provided on surfaces of semiconductor elements, respectively,
the base material and the plurality of semiconductor elements are connected together by the first connection patterns and the second connection patterns,
a first alignment mark segment formed of a same material as the first connection patterns is provided on the surface of the base material, and
a second alignment mark segment, which is configured with a first layer formed with a same material as that forming the second connection patterns and a second layer formed with a same material as that forming the semiconductor elements, is formed above the first alignment mark segment, and
the alignment mark is formed with the first alignment mark segment and the second alignment mark segment, wherein
the second alignment mark segment and one of the first connection patterns are connected with each other via a bump.

6. The semiconductor module according to claim 5, wherein
the base material and the plurality of semiconductor elements are connected together by the first connection patterns and the second connection patterns and form a current path, and
a portion between the first alignment mark segment and the second alignment mark segment is a non-current path.

7. The semiconductor module according to claim 5, wherein
a resin layer is provided between the plurality of semiconductor elements.

* * * * *